(12) United States Patent
Bardsley et al.

(10) Patent No.: US 7,091,793 B2
(45) Date of Patent: Aug. 15, 2006

(54) VARIABLE DECISION THRESHOLD APPARATUS

(75) Inventors: Richard Bardsley, Andover (GB); Sonia Ashmore, Ipswich (GB); Ian Claybourn, Ipswich (GB); Stuart Wilkinson, Manningtree (GB)

(73) Assignee: Avago Technologies Fiber IP(Singapore) Pte. Ltd., Singapore (SG)

( * ) Notice: Subject to any disclaimer, the term of this patent is extended or adjusted under 35 U.S.C. 154(b) by 41 days.

(21) Appl. No.: 10/910,244

(22) Filed: Aug. 3, 2004

(65) Prior Publication Data
US 2005/0062530 A1 Mar. 24, 2005

(30) Foreign Application Priority Data
Aug. 19, 2003 (GB) .................... 0319440.4

(51) Int. Cl.
*H03F 3/08* (2006.01)
*H03K 5/22* (2006.01)
(52) U.S. Cl. ........................ 330/308; 327/72
(58) Field of Classification Search .............. None
See application file for complete search history.

(56) References Cited
U.S. PATENT DOCUMENTS

| | | | |
|---|---|---|---|
| 4,635,142 A | 1/1987 | Haughland | 360/46 |
| 5,307,196 A * | 4/1994 | Kinoshita | 398/202 |
| 5,477,142 A | 12/1995 | Good et al. | 324/166 |
| 5,841,751 A * | 11/1998 | Komazaki et al. | 369/53.33 |
| 5,923,219 A | 7/1999 | Ide et al. | 330/308 |
| 6,360,090 B1 | 3/2002 | Holcombe et al. | 455/307 |
| 6,587,004 B1 * | 7/2003 | Ide | 330/308 |
| 6,909,082 B1 * | 6/2005 | Doh et al. | 250/214 AG |

FOREIGN PATENT DOCUMENTS

GB 2 293 931 4/1996

OTHER PUBLICATIONS

Tucker, British Patent Application No. GB 0319440.4 dated Jan. 20, 2004.

* cited by examiner

*Primary Examiner*—Robert Pascal
*Assistant Examiner*—Alan Wong

(57) ABSTRACT

A variable decision threshold apparatus includes a comparator for receiving the electrical signal and for comparing it to a threshold level. A signal strength monitor monitors the strength of the electrical signal and a scaler scales the decision threshold level to the measured amplitude of the electrical signal so that the percentage set as the threshold level is maintained.

14 Claims, 2 Drawing Sheets

VARIABLE DECISION THRESHOLD APPARATUS

FIELD OF THE INVENTION

The present invention relates, in general, to a variable decision threshold apparatus of a type that can vary a threshold level signal used for comparison with an input signal to provide an output indicative of whether the input signal is above or below the threshold level. The present invention also relates, in general, to a method of varying a threshold level used to compare to an input signal.

DISCUSSION OF THE BACKGROUND ART

In a digital communications system, data is represented by a number of discrete signal levels, for example, where the system allows only two discrete signal levels, the digital system is known as a binary system. In a binary system, the discrete signal levels are named bits and are given a LOGIC 1 or a LOGIC 0 value. In an optical communications system employing a binary system, a data stream comprising on (LOGIC 1) and off (LOGIC 0) bits can be transmitted by a transmitter in the form of an optical signal across an optical network of fibres and amplifiers to a receiver.

In order to interpret the transmitted data stream, the optical signal can be detected at the receiver by a photodetector to generate an electrical signal. On being communicated to a comparator, for example, a limiting amplifier, the electrical signal is compared to one or more threshold levels. A threshold level is a signal level, for example a voltage, defining a boundary between the upper and lower signal levels (the amplitude) of the electrical signal. An electrical signal having a signal level above the threshold is given a LOGIC 1 value, and an electrical signal having a signal level below the threshold is given a LOGIC 0 value. A threshold level can be expressed as a percentage of the amplitude of the electrical signal by:

$$\text{Threshold}\% = \left(\frac{V_{TH} - V_{DC}}{V_{AMP}} + \frac{1}{2}\right) \times 100 \quad (1)$$

Where, $V_{TH}$ is the threshold level expressed as a voltage; $V_{DC}$ is a DC level of the electrical signal representing an average fixed reference value of the amplitude of the electrical signal; and $V_{AMP}$ is the amplitude of the electrical signal expressed as a voltage being the difference between the upper and lower voltage levels of the electrical signal.

A measure of the quality of a communications link between a receiver and a transmitter is known as a Bit Error Rate (BER). The BER is a measure of the fraction of transmitted bits incorrectly interpreted at the receiver. For adequate performance of the communications link, a Network Equipment Manufacturer (NEM) typically requires a BER below one error bit in $10^{10}$ bits. One significant factor affecting the BER of an optical communications system is the signal to noise ratio of the optical signal. Noise can be added to the optical signal as a result of factors such as amplification of the optical signal, timing jitter and the bandwidth limitations of components employed in the communications network which process the data stream; As is known in the art, in terms of a data stream viewed as an eye diagram on a digital communications analyser, noise can cause the eye to close and optical amplifiers can add noise that cause the eye to become asymmetrical. As the eye closes and becomes asymmetrical, the margin or distance between the two logic levels becomes less, and therefore errors in determining whether a received signal represents a LOGIC 1 or a LOGIC 0 bit increases, thereby increasing the BER.

For example, for a 101010 data stream having a high signal to noise ratio and therefore a nearly ideal eye diagram, the optimum threshold level would correspond to substantially half-way between the maximum and minimum signal levels of the electrical signal generated by the receiver in response to the received data stream. Such a threshold level is known as a 50% threshold level in the art and can be derived from equation (1) above. However, should the 101010 data stream undergo several stages of amplification prior to being received at the receiver, noise may be introduced into the data stream causing the probability statistics of the data stream to change and the eye diagram to become asymmetrical. For such a data stream, the optimum threshold level could be at a signal level corresponding to a 40% threshold level. In order to maintain the BER at an acceptable level, it is known in the art that the optimum threshold level must be determined accurately and maintained to within a few per cent of its optimum value.

It is common for the threshold level to be controlled by a microprocessor, for example, it is known to interface a Digital-to-Analogue Converter (DAC) to a limiting amplifier. A suitable DAC may comprise 10 bits to provide 1024 discrete output levels and is typically programmed to operate over the full amplitude range of the electrical signal. For example, if the DAC is set for an amplitude of 400 mV, each discrete level of the 1024 discrete levels is set to a step resolution of 0.39 mV and is therefore capable of adjusting the threshold level to a resolution of 0.1% over the full amplitude range of the electrical signal. However, should the amplitude of the electrical signal fall to, for example, 5 mV as a result of a fall in the power of the received optical signal, each discrete level at a step resolution of 0.39 mV would only be capable of adjusting the threshold level to a resolution of 8% of the 5 mV amplitude of the electrical signal. Such a coarse resolution can result in poor control of the threshold value and therefore an increase in the BER as discussed above.

As such, NEMs must have the capacity to select an optimum threshold level at any value from the full amplitude range of an electrical signal. Also, a NEM must have the capability, at a suitable resolution, to maintain control of the threshold level to within a few per cent of its optimum value in an event of a change in power of a received optical signal and hence a change in amplitude of the generated electrical signal.

In an attempt to meet the above requirements, it is known to employ an Automatic Gain Control (AGC) amplifier prior to the limiting amplifier in order to provide a fixed value for the amplitude of the generated electrical signal independently of a change in the power of the received optical signal. In the above case, the AGC output would be fixed to 400 mV thereby ensuring that the amplitude range of the electrical signal communicated to limiting amplifier is fixed at 400 mV despite a fall in input signal power in order to ensure that the DAC is capable of adjusting the threshold level to a resolution of 0.1% over all input optical signal powers. A disadvantage of employing an AGC amplifier is that the extra amplifier increases manufacturing costs and power consumption in addition to using valuable circuit real estate.

Alternatively, an adaptive decision threshold setting circuit such as one disclosed in GB 2 293 931 can be employed. In GB 2 293 931, an input digital signal developed by a signal source is time averaged and mirrored by a current mirror to generate one or more decision thresholds. The thresholds may be a set or variable fraction of the average current and track any variation in the average current obviating a need for an AGC amplifier. A disadvantage of GB 2 293 931 is that in order to keep noise in the low level digital signal developed by the signal source to a minimum, it is necessary to redesign existing integrated circuits to realise the design on the first amplifier chip, thereby increasing costs and development times.

SUMMARY OF THE INVENTION

According to a first aspect of the present invention, there is provided a variable decision threshold apparatus comprising a comparator having at least one first input for receiving an input signal, a second input for receiving a decision threshold level control signal and at least one output for providing a signal based on a comparison of the input signal and a decision threshold level, a signal strength monitor for determining the strength of the input signal and having an output for providing a signal depending on the strength of the input signal, and a threshold level controller having a first input coupled to the output of the signal strength monitor and an output, coupled to the second input of the comparator, for providing the decision threshold level control signal depending on the strength of the input signal.

The threshold level controller may be adjustable in response to a change in amplitude of the input signal so as to substantially maintain the correspondence of the decision threshold level to a predetermined percentage of the amplitude of the input signal.

The apparatus can further comprise a microprocessor for receiving a signal indicating the predetermined percentage of the amplitude of the input signal that is required, the microprocessor having a plurality of first outputs for providing a plurality of discrete output levels to a Digital to Analogue Converter having an output coupled to a second input of the threshold level controller.

The threshold level controller may comprise a scaler having a first input coupled to the output of the signal strength monitor and an output coupled to an input of a decision threshold level control signal generator, wherein the scaler receives a signal indicative of the predetermined percentage of the amplitude of the input signal that is required, and controls the decision threshold level control signal generator so that an appropriate decision threshold level control signal is generated to the comparator.

The apparatus may further comprise a transimpedance amplifier having an input for receiving an input current and at least one output, coupled to the at least one input of the comparator, for generating the input signal from the input current.

The signal strength monitor can have at least one input coupled to the at least one input of the comparator for directly monitoring the signal strength of the input signal to the comparator.

Alternatively, the signal strength monitor may comprises a current mirror for generating a mirrored current corresponding to an input current, and a microprocessor coupled to the current mirror, wherein the microprocessor is programmable to determine the strength of the input signal from the mirrored current.

The scaler may comprise an amplifier circuit having a first input and an output and a variable feedback resistor coupled between the first input and the output of the amplifier circuit, wherein the resistance of the variable feedback resistor is adjustable by the microprocessor in response to the determined strength of the input signal.

The variable feedback resistor may be a digital potentiometer.

The decision threshold level control signal generator may comprise a current injector for adjusting the decision threshold level of the comparator, which may be a limiting amplifier.

According to a second aspect, the invention provides an optoelectronic system comprising a photodiode for receiving an optical signal and for generating a photocurrent in response thereto, and an apparatus as described above, wherein the input signal is generated from the photocurrent.

According to a third aspect, the invention provides a method of controlling a variable decision threshold level comprising the steps of determining the strength of an input signal; comparing the input signal to a decision threshold level corresponding to a predetermined percentage of the strength of the input signal; and scaling the decision threshold level to the determined strength of the input signal.

The decision threshold level may be adjusted in response to a change in amplitude of the input signal so as to substantially maintain the correspondence of the decision threshold level to the predetermined percentage of the amplitude of the input signal.

The method may further comprise the steps of generating a photocurrent and amplifying the photocurrent so as to generate the input signal.

It is thus possible to provide a variable decision threshold apparatus having a high percentage threshold level resolution and a power independent threshold level over all input optical powers. The apparatus is therefore more cost effective to manufacture and efficient in use than those apparatus presently used in the art.

BRIEF DESCRIPTION OF THE DRAWINGS

Two embodiments of the present invention will now be described, by way of example, with reference to the accompanying drawings, in which.

DETAILED DESCRIPTION OF THE PREFERRED EMBODIMENT

Figure 1:
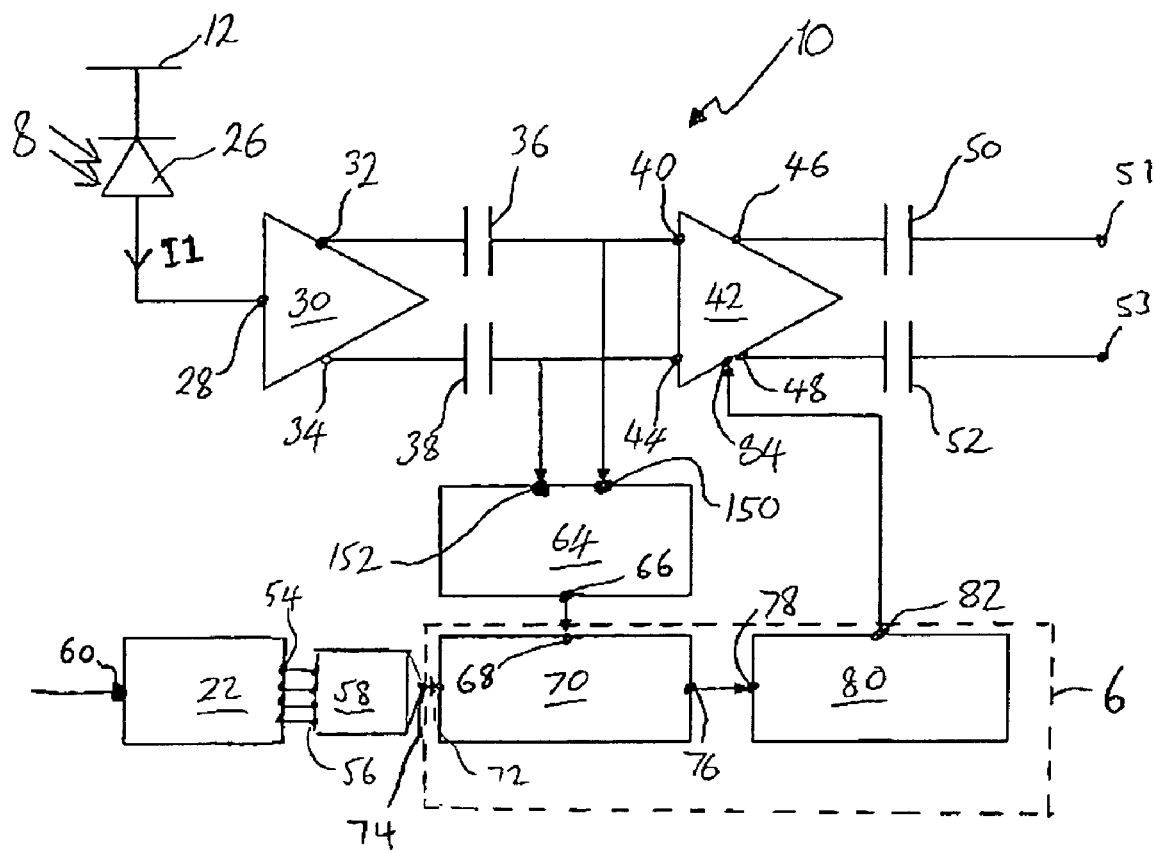
FIG. 1 is a schematic diagram of a variable decision threshold apparatus according to a first embodiment of the present invention.

Referring firstly to FIG. 1, in an optical communication system, a photodetector, such as a photodiode 26 is arranged to receive an optical signal 8 from an optical source, for example a laser diode, often via an optical fibre. The photodiode 8 has its cathode terminal coupled to a voltage supply rail 12 and its anode coupled to an input 28 of a transimpedance amplifier 30. The variable decision threshold apparatus 10 according to a first embodiment of the present invention comprises the transimpedance amplifier 30, a comparator, such as a limiting amplifier 42, and circuitry for determining the signal strength of the signal input to the comparator 42 and for controlling a decision threshold level of the comparator based on that signal strength.

The transimpedance amplifier 30 receives at an input terminal 28 a photocurrent generated by the photodiode 26 in response to the light signal 8. The transimpedance amplifier generates a complementary voltage signal at a non-inverting output terminal 32 and an inverting output terminal 34 that is representative of the photocurrent. The non-inverting output terminal 32 of the transimpedance amplifier 30 is coupled to a first input terminal 40 of the limiting amplifier 42 via a first capacitor 36, and the inverting output terminal 34 of the transimpedance amplifier 30 is coupled to a second input terminal 44 of the limiting amplifier 42 via a second capacitor 38. The limiting amplifier 42 comprises a first complementary output terminal 46 coupled via a third capacitor 50 to a first output node 51 for connection to an output device (not shown) and a second complementary output terminal 48 coupled via a fourth capacitor 52 to a second output node 53 for connection to the output device. The limiting amplifier 42 compares the complementary input signal to a threshold level set by a control signal at a control input terminal 84 and produces a digitized complementary output at the output terminals 46 and 48, which has an amplitude that is independent of the amplitude of the input signal, as is known in the art.

The first input terminal 40 of the limiting amplifier 42 is coupled to a first input terminal 150 of a signal strength monitor 64 and the second input terminal 44 of the limiting amplifier 42 is coupled to a second input terminal 152 of the signal strength monitor 64, for measuring the amplitude of the complementary input signal to the limiting amplifier. The signal strength monitor 64 has an output terminal 66 coupled to an input terminal 68 of a scaler 70. The scaler 70 comprises an output terminal 76 coupled to a first input terminal 78 of a current injector 80. The current injector 80 comprises an output terminal 82 coupled to an input port 84 of the limiting amplifier 42. The scaler 70 and the current injector 80 together form a threshold level controller 6. A microprocessor 22 has an input terminal 60 for receiving instructions as to a desired threshold level, based on a percentage of the amplitude of the input signal to the limiting amplifier. The instructions may be provided by a user, or may be generated automatically by other apparatus based on various criteria. The microprocessor 22 has a plurality of output terminals 54 coupled to a plurality of input terminals 56 of a Digital to Analogue Converter (DAC) 58.

The DAC 58 comprises 10 bits providing 1024 discrete output levels as is known in the art.

Thus, following transmission of an optical data stream, an optical signal 8 can be received and detected by the photodiode 26. In response to the received optical signal 8, the photodiode generates an electrical signal, such as a photocurrent I1, which is coupled to the input terminal 28 of the transimpedance amplifier 30. The amplitude of the photocurrent I1 is proportional to the power of the received optical signal.

The transimpedance amplifier 30 amplifies the photocurrent I1 and applies an inverted voltage output to the inverting output terminal 34 of the transimpedance amplifier 30 and a corresponding non-inverted voltage output to the non-inverting output terminal 32 of the transimpedance amplifier 30 so as to generate a differential voltage output, Vamp. Because of the wide dynamic range of the variable threshold controller apparatus 10, the differential voltage output, Vamp, of the transimpedance amplifier 30 is analogue and can vary in amplitude, the amplitude of the differential voltage output, Vamp varying in response to a change in the power of the received optical signal 8. This voltage swing, i.e. the peak-to-peak range, of the input to the limiting amplifier 42, $V_{AMP}$, is measured directly by the signal strength monitor 64. For example, a received optical signal 8 having a power of -6 dBm results in a generated photocurrent, I1, of 2 mA and a consequential amplified differential voltage output, Vamp, of 400 mV. The differential voltage output, Vamp, is applied to the first and second input terminals 40, 44 of the limiting amplifier 42 by way of the first capacitor 36 and the second capacitor 38 respectively.

The signal strength monitor 64 provides the value of $V_{AMP}$ to the threshold level controller 6 so that the threshold level of the limiting amplifier 42 can be adjusted to compensate for variations in the average or maximum amplitude of the signal input to the limiting amplifier 42. As mentioned above, the output of the DAC 58 is determined by the microprocessor 22 to provide a required percentage threshold level. The scaler 70 then compensates, or scales, the required percentage level in accordance with the measured signal strength (or amplitude), as determined by the signal strength monitor 64, and controls the current injector 80 so as that an appropriate level of current is injected from the output terminal 82 of the current injector 80 into the input port 84 of the limiting amplifier 42 in order that the threshold level of the limiting amplifier 42 can be varied accordingly.

Figure 2:
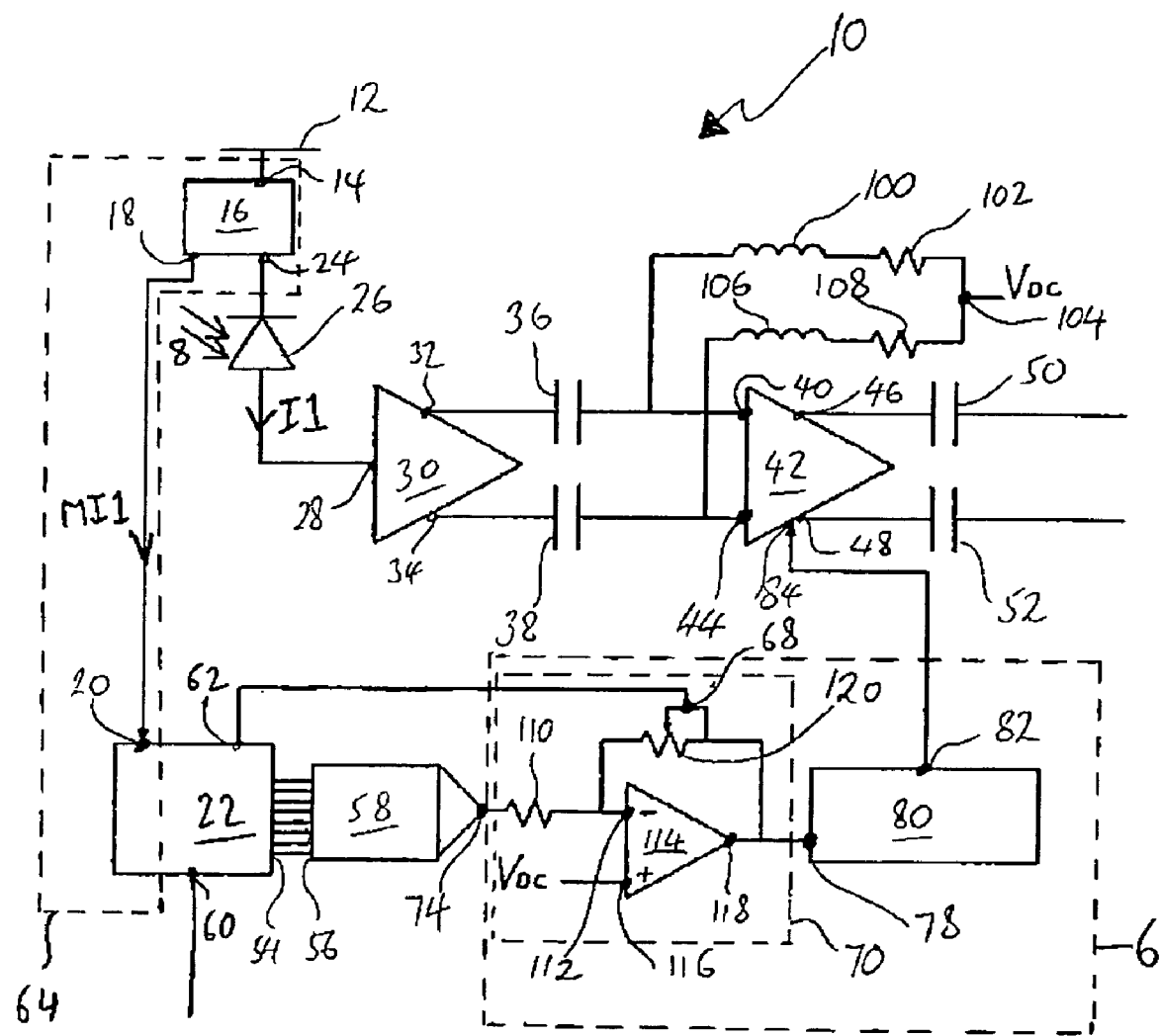
FIG. 2 is a schematic diagram of a variable decision threshold apparatus according to a second embodiment of the present invention.

Referring to FIG. 2, identical reference numerals are used to identify identical elements to those of FIG. 1. In this second embodiment, the signal strength monitor 64 does not take the input signal to the limiting amplifier 42 directly. Instead, the signal strength monitor is formed, essentially, by a current mirror 16 and the microprocessor 22. The current mirror 16 has a first terminal 14 coupled to the voltage supply rail 12 and a second terminal 18 coupled to an input terminal 20 of the microprocessor 22. The current mirror 16 also comprises a third terminal 24 coupled to a cathode terminal of the photodiode 26.

A first inductor 100 having an inductance of 100 nH has a first terminal coupled to the second terminal of the first capacitor 36 and to the first input terminal 40 of the limiting amplifier 42. A second terminal of the first inductor 100 is coupled to a first terminal of a third resistor 102 having a resistance of 10 kΩ. A first terminal of a second inductor 106 having an inductance of 100 nH is coupled to the second terminal of the second capacitor 38 and to the second input terminal 44 of the limiting amplifier 42. A second terminal of the second inductor 106 is coupled to a first terminal of a fourth resistor 108 having a resistance of 10 kΩ. Second terminals of the third resistor 102 and the fourth resistor 108 are coupled together and to an output node 104. Thus, the inductors 100 and 106 and resistors 102 and 108 together form a low pass filter to measure the average DC value $V_{DC}$ of the input signal to the limiting amplifier 42. Because the input signal is AC coupled to the limiting amplifier, 42, $V_{DC}$ is a function of the limiting amplifier, which can be preset to a predetermined value.

In this embodiment, the scaler 70 comprises a first resistor 110 having a first terminal coupled to the output terminal 74 of the DAC 58 and having a resistance of 10 kΩ. The first resistor 110 also has a second terminal coupled to an inverting input terminal 112 of a second amplifier, such as an operational amplifier 114. The operational amplifier 114 also has a non-inverting input terminal 116 connected to receive the average DC voltage signal $V_{DC}$ and further has an output terminal 118. The output terminal 118 of the operational amplifier 114 is coupled, in a feedback arrangement as is known in the art, to a first terminal of a second resistor, for example a variable resistor 120 such as a digital potentiometer. The variable resistor 120 comprises a second terminal coupled in feedback to the inverting input terminal 112 of the operational amplifier 114. A control terminal 68 of the variable resistor 120 is coupled to a control output terminal 62 of the microprocessor 22. The output terminal 118 of the operational amplifier 114 is also coupled to the input terminal 78 of the current injector 80.

As in the previous embodiment, the photocurrent I1 is generated by the photodiode 26 in response to the received light signal. The photocurrent is mirrored by the current mirror 16, as is known in the art, to generate a mirrored current M I1 to flow to an analogue input terminal 20 of the microprocessor 22. It is known in the art that a transfer function can be determined between the power of a received optical signal 8 and the differential voltage output, Vamp, of a transimpedance amplifier 30, based on the known transfer characteristics of the transimpedance amplifier 30. Therefore, based on that known transfer function, on receipt of the mirrored photocurrent MI1, the microprocessor 22 determines what the differential voltage output, Vamp from the transimpedance amplifier 30 will be.

If the limiting amplifier 42 is set for a 50% threshold level and the DAC 58 is programmed to control an electrical signal over an amplitude of 400 mV, should the microprocessor 22 determine $V_{AMP}$ to be 400 mV, the microprocessor 22 communicates a signal based on the determined value of Vamp to the DAC 58. The microprocessor 22 can control the gain of the operational amplifier 114 by controlling the resistance of the variable resistor 120. The variable resistor 120 can be a digital potentiometer whose wiper terminal position is controlled by the microprocessor 22. The operational amplifier 114 receives the reference signal $V_{DC}$ (the fixed DC offset value of the limiting amplifier 42) applied to its non-inverting input terminal 116.

For an input signal having a maximum amplitude of 400 mV, $V_{DC}$ can therefore be set to 200 mV and, with reference to equation 1 above, the limiting amplifier 42 can be set to a threshold level of 50% by setting $V_{TH}$ to be substantially equal to $V_{DC}$. The threshold level, $V_{TH}$ can be controlled by way of an external terminal of the limiting amplifier 42, which can be connected via an external capacitor (not shown) coupled to the current injector 80 as is known in the art, so as to improve the low frequency performance. Adjusting the threshold level $V_{TH}$, with respect to the fixed DC offset value, $V_{DC}$, the percentage threshold level can be altered. The DAC 58 is typically programmed to control the current injector 80 and to operate over the full amplitude range of the electrical signal. For example, if the DAC 58 is set for the maximum amplitude of the electrical signal of 400 mV, each discrete level of the 1024 discrete levels is set to a step resolution of 0.39 mV and is therefore capable of adjusting the threshold level to a resolution of 0.1%.

If the variable resistor is set to 10 kΩ to substantially match the resistance of the first resistor 110, the gain of the operational amplifier 114 is unity and the current injector 80 is not initiated to alter $V_{TH}$ and therefore $V_{TH}$ remains at the previously set threshold of 200 mV to provide the percentage threshold level of 50%.

However, if, for example, a received optical signal 8 having a power of -32 dBm is received by the photodiode 26, this results in a generated photocurrent, I1 of 6 μA. In response to the received photocurrent, I1, the transimpedance amplifier 30 generates an amplified differential voltage output, Vamp of 5 mV. The microprocessor 22 therefore adjusts the variable resistor to 125Ω thereby adjusting the gain of the operational amplifier 114 causing the current injector 80 to initiate a change in the threshold level, $V_{TH}$ in order to maintain the percentage threshold level at the chosen optimum value of, for example, 50%. It should be appreciated that the DAC 58 can alter the values of $V_{TH}$ over the full amplitude range of $V_{AMP}$, that is, over 5 mV so that the percentage threshold level resolutions remain at 0.1%.

It will be appreciated that although only two particular embodiments of the invention have been described in detail, various modifications and improvements can be made by a person skilled in the art without departing from the scope of the present invention. For example, although one aspect of the invention has been described in relation to the use of the variable decision threshold apparatus in conjunction with a photodiode in an optoelectronic system, it will be appreciated that the invention is not limited to systems where the input signal is generated from a photodiode, but is applicable to any situation where an input signal (however obtained) is to be compared to a threshold level that may need to be scaled to compensate for variations in the maximum amplitude, or average DC level of the input signal.

The invention claimed is:

1. A variable decision threshold apparatus comprising:
   a comparator having a first input for receiving an input signal, a second input for receiving a decision threshold level control signal, and an output for providing a signal based on a comparison of the input signal and a decision threshold level;
   a signal strength monitor for determining a strength of the input signal and having an output for providing a signal depending on the strength of the input signal, wherein the signal strength monitor includes a current mirror for generating a mirrored current corresponding to an input current, and a microprocessor coupled to the current mirror, wherein the microprocessor determines the strength of the input signal from the mirrored current; and
   a threshold level controller having a first input coupled to the output of the signal strength monitor and an output, coupled to the second input of the comparator, for providing the decision threshold level control signal depending on the strength of the input signal.

2. The apparatus of claim 1, wherein the threshold level controller is adjustable in response to a change in amplitude of the input signal so as to substantially maintain a correspondence of the decision threshold level to a predetermined percentage of the amplitude of the input signal.

3. The apparatus of claim 2, wherein the microprocessor receives a signal indicating the predetermined percentage of the amplitude of the input signal, and has a plurality of first outputs for providing a plurality of discrete output levels to a digital to analogue converter having an output coupled to a second input of the threshold level controller.

4. The apparatus of claim 2,
   wherein the threshold level controller comprises a scaler having a first input coupled to the output of the signal strength monitor, and an output coupled to an input of a decision threshold level control signal generator, and
   wherein the sealer receives a signal indicative of the predetermined percentage of the amplitude of the input signal, and controls the decision threshold level control signal generator so that an appropriate decision threshold level control signal is generated to the comparator.

5. The apparatus of claim 1, further comprising a transimpedance amplifier having an input that receives the input current, and an output coupled to the first input of the comparator, wherein the transimpedance amplifier generates the input signal from the input current.

6. The apparatus of claim 1, wherein the signal strength monitor has an input coupled to the first input of the comparator for directly monitoring the signal strength of the input signal to the comparator.

7. The apparatus of claim 4,
wherein the scaler comprises an amplifier circuit having a first input and an output and a variable feedback resistor coupled between the first input and the output of the amplifier circuit, and
wherein the variable feedback resistor is adjustable by the microprocessor in response to the determined strength of the input signal.

8. The apparatus of claim 7, wherein the variable feedback resistor is a digital potentiometer.

9. The apparatus of claim 4, wherein the decision threshold level control signal generator comprises a current injector for adjusting the decision threshold level of the comparator.

10. The apparatus of claim 4, wherein the comparator comprises a limiting amplifier.

11. An optoelectronic system comprising:
a photodiode for receiving an optical signal and for generating a photocurrent in response thereto; and the apparatus of claim 1,
wherein the input signal is generated from the photocurrent.

12. A method of controlling a variable decision threshold level comprising:
generating a mirrored current corresponding to an input current;
determining a strength of an input signal from the mirrored current;
scaling a decision threshold level to the determined strength of the input signal, wherein the decision threshold level corresponds to a predetermined percentage of the strength of the input signal; and
comparing the input signal to the decision threshold level.

13. The method of claim 12, wherein the decision threshold level is adjusted in response to a change in amplitude of the input signal so as to substantially maintain the correspondence of the decision threshold level to the predetermined percentage of the amplitude of the input signal.

14. The method of claim 13, further comprising generating a photocurrent; and amplifying the photocurrent so as to generate the input signal.

* * * * *

UNITED STATES PATENT AND TRADEMARK OFFICE
CERTIFICATE OF CORRECTION

PATENT NO. : 7,091,793 B2  Page 1 of 1
APPLICATION NO. : 10/910244
DATED : August 15, 2006
INVENTOR(S) : Richard Bardsley et al.

It is certified that error appears in the above-identified patent and that said Letters Patent is hereby corrected as shown below:

On the title page, item [73]: First Page (assignee), Line 2, delete "IP(Singapore)" and insert -- IP (Singapore) --;

Column 8, Line 54, Claim 4, delete "sealer" and insert -- scaler --.

Signed and Sealed this

Eighth Day of June, 2010

David J. Kappos
*Director of the United States Patent and Trademark Office*